(12) United States Patent
Shin

(10) Patent No.: US 10,141,923 B2
(45) Date of Patent: Nov. 27, 2018

(54) SYSTEM AND METHOD FOR ELIMINATING GATE VOLTAGE OSCILLATION IN PARALLELED POWER SEMICONDUCTOR SWITCHES

(71) Applicant: TOYOTA MOTOR ENGINEERING & MANUFACTURING NORTH AMERICA, INC., Erlanger, KY (US)

(72) Inventor: Jongwon Shin, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 257 days.

(21) Appl. No.: 15/247,248

(22) Filed: Aug. 25, 2016

(65) Prior Publication Data

US 2018/0062634 A1    Mar. 1, 2018

(51) Int. Cl.
  *H03K 17/041* (2006.01)
  *H03K 17/16* (2006.01)
  *H03K 17/0814* (2006.01)
  *H03K 17/90* (2006.01)
  *H03K 17/082* (2006.01)

(52) U.S. Cl.
  CPC ....... *H03K 17/167* (2013.01); *H03K 17/0822* (2013.01); *H03K 17/08142* (2013.01); *H03K 17/90* (2013.01); *H03K 17/04106* (2013.01)

(58) Field of Classification Search
  CPC ............. H03K 17/167; H03K 17/0822; H03K 17/162; H03K 17/08142; H03K 17/90; H03K 17/04106
  See application file for complete search history.

(56) References Cited

U.S. PATENT DOCUMENTS

| 5,124,595 A | 6/1992 | Mandelcorn |
| 5,341,004 A | 8/1994 | Furuhata |

(Continued)

FOREIGN PATENT DOCUMENTS

| CN | 103944549 | 7/2014 |
| DE | 19938302 | 3/2000 |
| JP | 3017545 | 3/2000 |
| JP | 2000299925 | 10/2000 |
| JP | 2001015672 | 1/2001 |

OTHER PUBLICATIONS

Andrew Lemmon et al.; "*Instability in Half-Bridge Circuits Switched With Wide Band-Gap Transistors*"; IEEE Transactions on Power Electronics, vol. 29, No. 5, May 2014; (13 pages).

(Continued)

*Primary Examiner* — Zeev V Kitov
(74) *Attorney, Agent, or Firm* — Snell & Wilmer LLP

(57) ABSTRACT

Methods, systems, and apparatus for eliminating gate voltage oscillation without increasing switching power loss in paralleled power semiconductor switches at high current turn-off. The damping circuit includes a switch for driving voltage and multiple resistors and multiple inductors. The damping circuit includes multiple capacitors connected to the multiple inductors. The damping circuit includes multiple power semiconductor switches that are connected to the multiple inductors at gate terminals. The damping circuit includes multiple gate terminal resistors connected in parallel to the multiple power semiconductor switches at the gate terminals and multiple gate terminal switches connected to the multiple gate terminal resistors.

20 Claims, 11 Drawing Sheets

(56) References Cited

U.S. PATENT DOCUMENTS

| | | | |
|---|---|---|---|
| 5,436,786 A | | 7/1995 | Pelly et al. |
| 5,621,601 A | * | 4/1997 | Fujihira ............ H01L 27/0248 |
| | | | 361/115 |
| 5,729,120 A | | 3/1998 | Stich et al. |
| 5,864,456 A | * | 1/1999 | Connor ............ G05B 19/0425 |
| | | | 327/380 |
| 5,920,808 A | | 7/1999 | Jones et al. |
| 6,462,434 B1 | | 10/2002 | Winick et al. |
| 9,065,326 B2 | | 6/2015 | Häfner et al. |
| 2005/0194660 A1 | | 9/2005 | Mochizuki et al. |
| 2012/0230063 A1 | * | 9/2012 | Okitsu ............ H02M 3/338 |
| | | | 363/21.12 |
| 2013/0049707 A1 | * | 2/2013 | Wang ............ H02P 6/00 |
| | | | 322/21 |
| 2014/0091324 A1 | * | 4/2014 | Zushi ............ H02M 1/08 |
| | | | 257/77 |
| 2014/0312400 A1 | | 10/2014 | Schmidt et al. |
| 2017/0163159 A1 | * | 6/2017 | Tschirhart ......... H02M 3/33507 |

OTHER PUBLICATIONS

Hong Yao Long et al.; "*Investigation of Negative Gate Capacitance in MOS-Gated Power Devices*"; IEEE Transactions on Electron Devices, vol. 59, No. 12, Dec. 2012; (7 pages).

Rui Wu et al; "*Study on Oscillations During Short Circuit of MW-Scale IGBT Power Modules by Means of a 6-kA/1.1-kV Nondestructive Testing System*"; IEEE Journal of Emerging and Selected Topics in Power Electronics, vol. 3, No. 3, Sep. 2015 (11 pages).

Takeshi Ohi et al.; "*Investigation of Gate Voltage Oscillations in an IGBT Module Under Short Circuit Conditions*"; Power Electronics Specialists Conference, 2002 (6 pages).

Seung-Chul Lee et al.; "*Investigation of Gate Oscillation of Power MOSFETs Induced by Avalanche Mode Operation*"; Proceedings of the 19$^{th}$ International Symposium on Power Semiconductor Devices & ICs May 27-30, 2007; (4 pages).

* cited by examiner

SYSTEM AND METHOD FOR ELIMINATING GATE VOLTAGE OSCILLATION IN PARALLELED POWER SEMICONDUCTOR SWITCHES

BACKGROUND

1. Field

This specification relates to a system and a method for eliminating gate voltage oscillation in paralleled power semiconductor switches.

2. Description of the Related Art

Semiconductor devices are used in microprocessor chips and transistors in electronics. A power semiconductor device is a semiconductor device used as a switch or a rectifier in power electronics. Many industries including the computer, telecommunication and automotive industries use power semiconductor devices. Minimizing power loss, chip size, and energy dissipation is essential in semiconductor design. The use of integrated circuit technologies on power semiconductor devices offers more efficient designs. Common power semiconductor devices include the power diodes, thyristors, power metal oxide semiconductor field-effect transistors (MOSFETs) and insulated gate bipolar transistors (IGBTs).

Power semiconductor devices are connected in parallel to increase the maximum current or power delivered to an electronic device. As a result, an increasing amount of power is lost due to energy dissipation, such as switching power loss. Additionally, voltage oscillation across gate and source terminals of power semiconductor devices may occur and damage the electronic device.

Accordingly, there is a need for a system and a method for eliminating gate voltage oscillation at high current turn-off without an increase in switching loss in paralleled power semiconductor switches.

SUMMARY

In general, one aspect of the subject matter described in this specification is embodied in a damping circuit for a semiconductor device. The damping circuit includes a switch having an input terminal and an output terminal for driving voltage. The damping circuit includes multiple resistors connected to the output terminal of the switch and including a first resistor and a second resistor. The first resistor and the second resistor being connected in parallel. The damping circuit includes multiple inductors including a first inductor and a second inductor. The first inductor is connected to the first resistor and the second inductor is connected to the second resistor. The damping circuit includes multiple capacitors that are connected to the multiple inductors and provide capacitance for electrical storage. The damping circuit includes multiple power semiconductor switches. The multiple power semiconductor switches include a first power semiconductor switch that has a first gate terminal and a second power semiconductor switch that has a second gate terminal. The first semiconductor switch being connected to an output of the first inductor and the second semiconductor switch being connected to an output of the second inductor. The damping circuit includes multiple gate terminal resistors. The multiple gate terminal resistors include a first gate terminal resistor connected in parallel to the first power semiconductor switch at the first gate terminal and a second gate terminal resistor connected in parallel to the second power semiconductor switch at the second gate terminal. The damping circuit includes multiple gate terminal switches. The multiple gate terminal switches include a first gate terminal switch connected with the first gate terminal resistor and a second gate terminal switch connected with the second gate terminal resistor.

These and other embodiments may optionally include one or more of the following features. The switch may include at least one or more metal oxide silicon field effect transistors (MOSFETs), one or more insulated gate bipolar transistors (IGBTs), one or more bipolar junction transistors (BJTs), or one or more gallium nitride field effect transistors (GaN FETs). The first and second gate terminal switches and the first and second semiconductor switches may each be a MOSFET, IGBT, BJT or GaN FET.

The multiple gate terminal resistors and the multiple gate terminal switches may form a gate loop that eliminates gate voltage oscillation without increasing switching loss when an overcurrent is detected. The multiple power semiconductor switches may include a third power semiconductor switch that has a third gate terminal. The third power semiconductor switch may be connected in parallel to the first semiconductor switch and the second semiconductor switch. The multiple gate terminal resistors may include a third gate terminal resistor connected in parallel to the third power semiconductor switch at the third gate terminal. The multiple gate terminal switches may include a third gate terminal switch connected with the third gate terminal resistor.

The damping circuit may include a sensor connected to the multiple gate terminal switches and configured to detect a fault condition including a current load greater than or equal to a threshold value. The sensor may be a Hall Effect sensor or may include a differential amplifier with series-connected resistor 701. The sensor may detect that a current is greater than or equal to a threshold value as the voltage and the current transition off and cause the first gate terminal switch and the gate terminal switch to turn on.

The multiple resistors and the multiple inductors may provide impedance that is directly correlated with the mount of switching loss that results from the voltage transitioning off.

In another aspect, the subject matter is embodied in a damping circuit for a semiconductor device. The damping circuit may include multiple power semiconductor switches to power the semiconductor device. The damping circuit may include a sensor connected to the multiple power semiconductor switches. The sensor may be configured to detect an overcurrent fault. The damping circuit may include multiple gate terminal resistors that are connected in parallel to the multiple power semiconductor switches. The damping circuit may include multiple gate terminal switches connected in series to the multiple gate terminal resistors. The multiple gate terminal switches may be configured to eliminate gate voltage oscillation.

In another aspect, the subject matter is embodied in a damping circuit for a semiconductor device. The damping circuit may include one or more gate driver switches. The one or more gate driver switches may have an output voltage port for driving voltage. The damping circuit may include a first gate loop for normal operation. The first gate loop may have multiple power semiconductor switches. The multiple power semiconductor switches may have multiple gate terminals. The first gate loop may have multiple resistors connected to the one or more gate driver switches. The first gate loop may have multiple inductors connected to the multiple resistors. The multiple resistors and the multiple inductors may provide impedance. The first gate loop may have multiple capacitors connected to the multiple inductors and the multiple power semiconductor switches.

The damping circuit may include a second gate loop for eliminating gate voltage oscillation when a fault condition is detected. The second gate loop may have multiple gate terminal resistors connected to the multiple gate terminals and the multiple gate terminal switches. The multiple gate terminal resistors and the multiple gate terminal switches may be configured to eliminate the gate voltage oscillation.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Disclosed herein are systems, vehicles and methods for implementing, disabling and isolating electrical components. Particular embodiments of the subject matter described in this specification may be implemented to realize one or more of the following advantages. A gate voltage oscillation damping circuit ("damping circuit") for paralleled power semiconductor devices eliminates gate voltage oscillation at high current turn-off. Gate voltage oscillation occurs as a result of resonance between parasitic inductances and capacitances in a gate loop formed more frequently in parallel power semiconductor switches than with a single power semiconductor switch. The gate voltage oscillation damages electronic devices and is more likely to occur when the current is turned-off from a higher level of current, such as in a short-circuit. The damping circuit eliminates the gate voltage oscillation in the paralleled power semiconductor switches and provides overcurrent protection without increasing switching loss. By eliminating the gate voltage oscillation and providing overcurrent protection, the damping circuit increases the lifetime of the semiconductor device and increases the availability and durability of the connected electronic device.

Other benefits and advantages include allowing for a fast turn-off transition for a high current turn-off. By allowing for a fast turn-off transition for a high current turn-off, wide band gap devices may implement or use the damping circuit to eliminate gate voltage oscillation that results from their faster switching speeds. Additionally, the power semiconductor devices may more efficiently power electronic devices by minimizing switching power loss.

Figure 1:
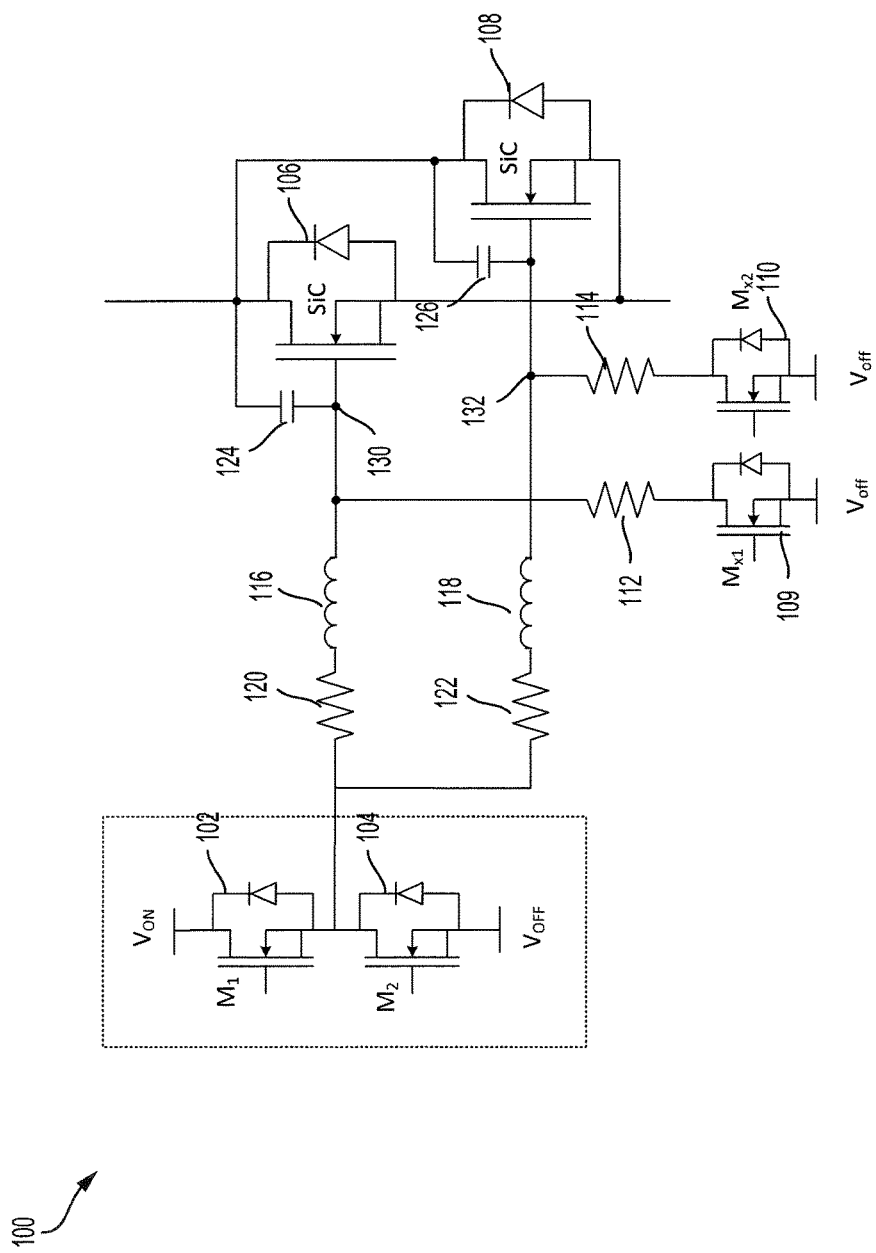
FIG. 1 is a schematic diagram of a gate voltage oscillation damping circuit for paralleled power semiconductor switches according to an aspect of the invention.

FIG. 1 is a circuit diagram of a gate voltage oscillation damping circuit 100 that eliminates gate voltage oscillation without increasing switching loss in a paralleled power semiconductor switch. The damping circuit 100 includes one or more gate driver switches, e.g., two gate driver switches 102, 104, two or more power semiconductor switches, e.g., two power semiconductor switches 106, 108, two or more gate terminal switches, e.g., two gate terminal switches 109, 110 and two or more gate terminal resistors, e.g., two gate terminal resistors 112, 114. The damping circuit 100 may include one or more inductors, e.g., two inductors 116, 118, one or more resistors, e.g., two resistors 120, 122, and/or one or more capacitors, e.g., two capacitors 124, 126.

A switch, such as one of the gate terminal switches 109, 110, one of the gate driver switches 102, 104 or one of the power semiconductor switches 106, 108, may be a silicon metal oxide silicon field effect transistor (Si MOSFET), a silicon insulated gate bipolar transistor (Si IGBT), a gallium nitride field effect transistor (GaN FET) or a bipolar junction transistor (BJT).

Figure 2:
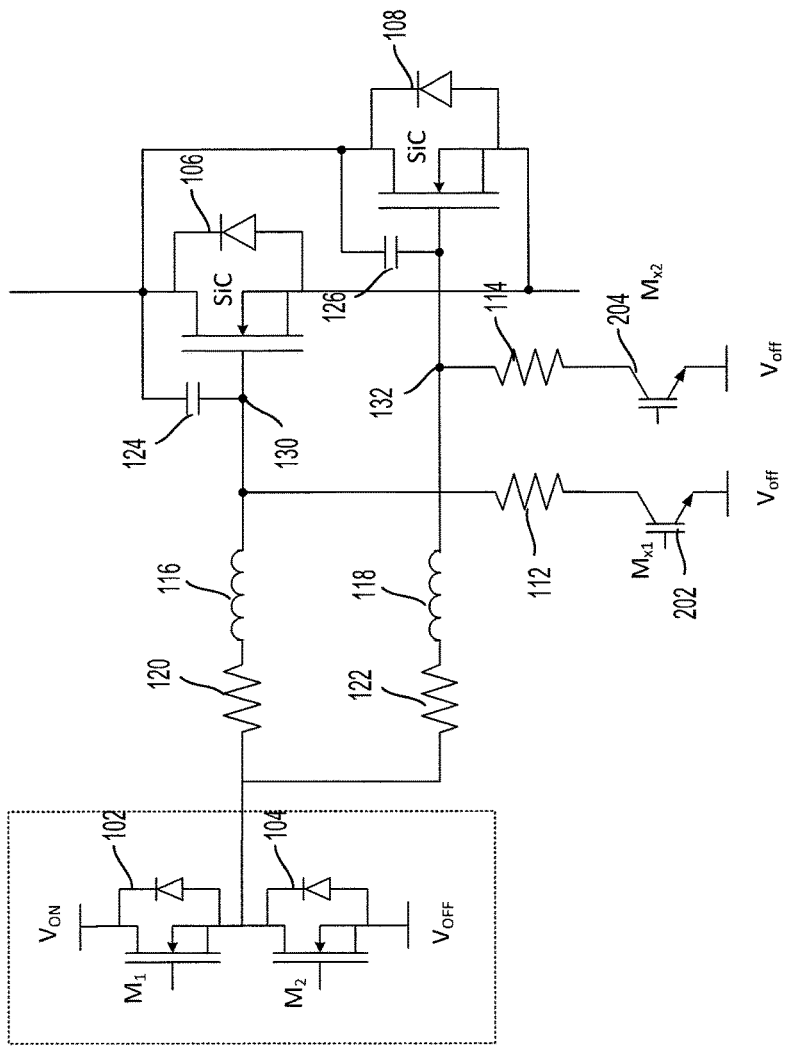
FIG. 2 is a schematic diagram of a gate voltage oscillation damping circuit using two insulated gate bipolar transistors (IGBTs) as the gate terminal switches according to an aspect of the invention.
Figure 3:
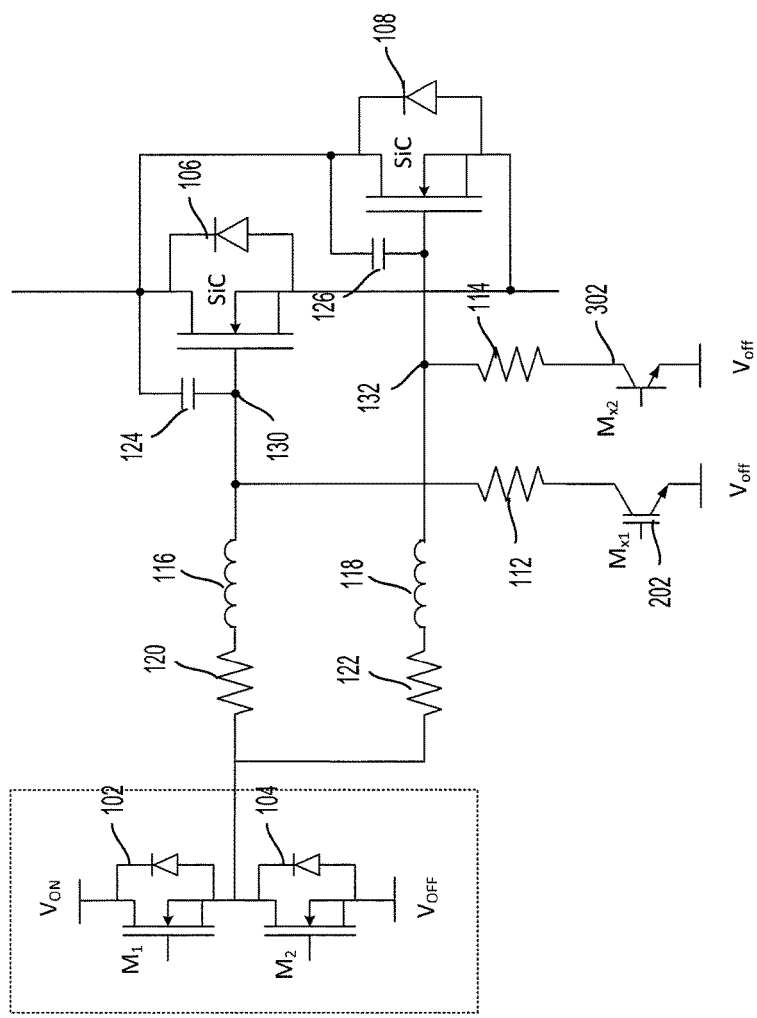
FIG. 3 is a schematic diagram of a gate voltage oscillation damping circuit using an IGBT and a bipolar junction transistor (BJT) as the gate terminal switches according to an aspect of the invention.
Figure 4:
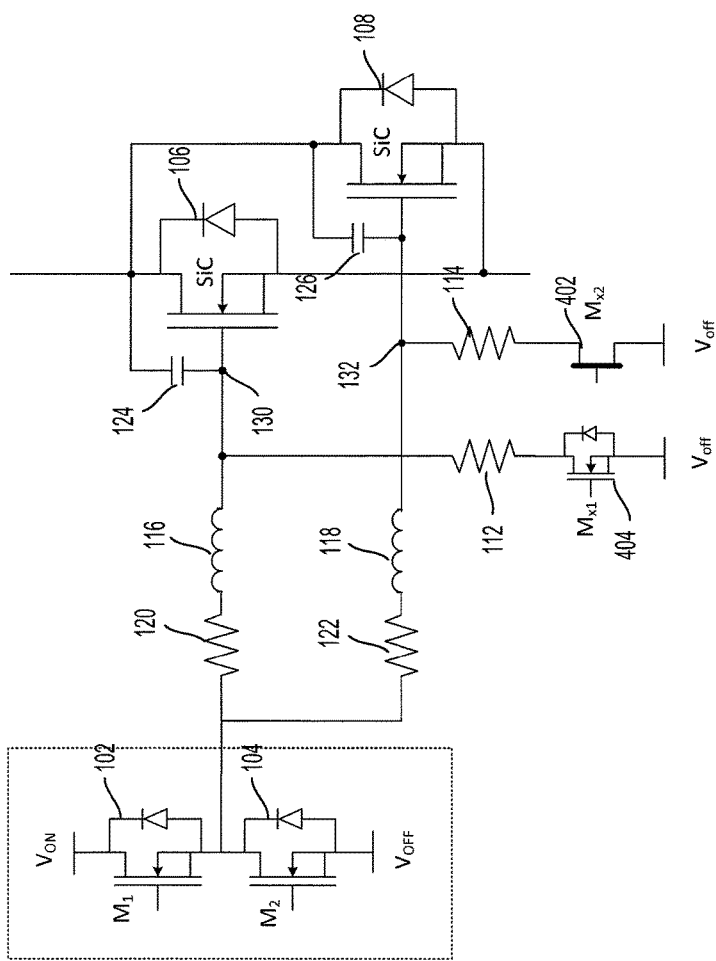
FIG. 4 is a schematic diagram of a gate voltage oscillation damping circuit using a MOSFET and a gallium nitride field effect transistor (GaN FET) as the gate terminal switches according to an aspect of the invention.

The switches of the damping circuit 100, such as the two power semiconductor switches 106, 108, the two gate terminal switches 109, 110 and the two gate driver switches 102, 104 are shown as MOSFETs. However, the switches may be implemented as MOSFETs, IGBTs, GaN FETs, BJTs or any combination of the different switches. FIGS. 2-4 show different combination of switches used for the two gate terminal switches 109, 110. The damping circuit 100 may use any combination of the different switches for the gate driver switches 102, 104, the power semiconductor switches 106, 108 and/or the gate terminal switches 109, 110.

The gate driver switches 102, 104 each have an input voltage port and are connected to each other to provide an output voltage ($V_{gs}$) through an output voltage port for driving voltage to the two or more power semiconductor switches 106, 108. A connection refers to an electrical and/or mechanical connection. A voltage is provided to each input voltage port of the gate driver switches 102, 104. The gate driver switches 102, 104 toggle between the on and off positions. The gate driver switches 102, 104 drive a voltage to the two or more power semiconductor switches 106, 108 based on the detection of an overcurrent. The timing of the gate driver switches 102, 104 is further described in reference to FIG. 8.

The gate driver switches 102, 104 connect to the power semiconductor switches 106, 108 and/or the gate terminal switches 109, 110. The gate driver switches 102, 104 may connect to the power semiconductor switches 106, 108 through the one or more resistors 120, 122 and/or the one or more inductors 116, 118. The one or more resistors 120, 122 and/or the one or more inductors 116, 118 can be parasitic elements or can be implemented by discrete components. For example, a first resistor 120 and a second resistor 122 may be connected in parallel to the output voltage port. A first inductor 116 may be connected in series with the first resistor 120, and a second inductor 118 may be connected in series with the second resistor 122. The first inductor 116 connects at a first gate terminal 130 to a first capacitor 124 and a first power semiconductor switch. The second inductor 118 connects at a second gate terminal 132 to a second capacitor 126 and a second power semiconductor switch 108.

The one or more inductors 116, 118 each have an input terminal and an output terminal. The one or more inductors 116, 118 create an inductance. The one or more inductors 116, 118 may reside in the copper trace or the lid frame of the semiconductor device and may be parasitic. The input terminal of the one or more inductors 116, 118 may be connected to the one or more resistors 120, 122. The output terminal of each of the one or more inductors 116, 118 may be connected to one or more capacitors 124, 126 and the two or more power semiconductor switches 106, 108 at the two or more gate terminals 130, 132. For example, the first inductor 116 is connected to the first capacitor 124 and the first power semiconductor switch 106 at the first gate terminal 130, and the second inductor 118 is connected to the second capacitor 126 and the second power semiconductor switch 108 at the second gate terminal 132.

Figure 9:
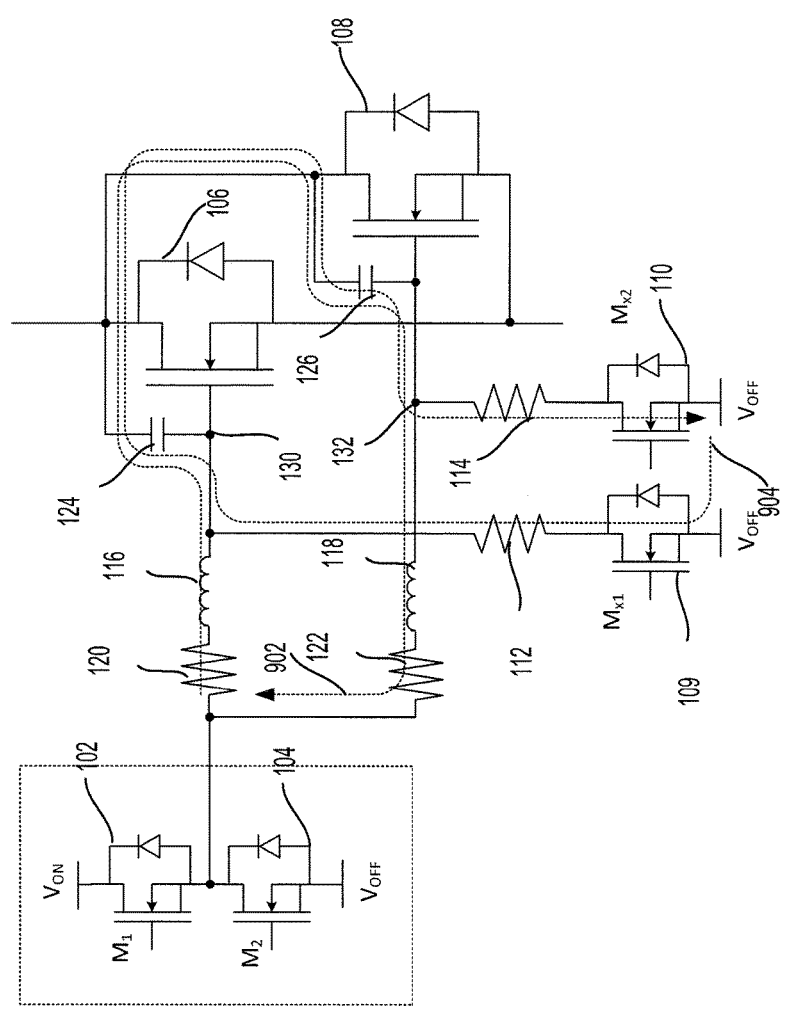
FIG. 9 is a schematic diagram of gate loops for a gate voltage oscillation damping circuit according to an aspect of the invention.

One or more capacitors 124, 126 may connect in parallel to the two or more power semiconductor switches 106, 108 and provide a capacitance to store electrical energy within the damping circuit 100. The one or more capacitors 124, 126 may be Miller capacitances which may reside between the input and the output of the power semiconductor switches 106, 108. A Miller capacitance is a parasitic capacitance between the input and the output of a transistor. The one or more resistors 120, 122, the one or more inductors 116, 118, the one or more capacitors 124, 126 and the two or more power semiconductor switches 106, 108 may form a first gate loop 902, as shown in FIG. 9. The one or more inductors 116, 118 in combination with the one or more capacitors 124, 126 cause the resonance in the first gate loop 902. The first gate loop 902 may have one or more switches, such as the switches 1002, 1004 of FIG. 10, that may isolate the two gate driver switches 102, 104, the two resistors 120, 122, and the two inductors 116, 118 from the second gate loop 904 when the inductance is below a threshold value.

When the voltage, $V_{gs}$, decreases and transitions off at the gate terminals 130, 132, the drain current, $i_d$, that flows through a junction of the power semiconductor switches 106, 108 decreases and the drain to source voltage, $Y_{DS}$, increases. As the drain current, $i_d$, transitions low and toward the off position, energy that circulates within the first gate loop 902 may cause gate voltage oscillation. The gate voltage oscillation may be less than, greater than or equal to the direct current (DC) voltage $V_{gs}$. The gate voltage oscillation is more likely to occur when the drain current, $i_d$, is higher, e.g., when $i_d$ is a short-circuit current.

The one or more resistors 120, 122 and the one or more inductors 116, 118 provide a gate impedance, Z, that may slow down a turn-off transition of the voltages, $V_{gs1}$ and $V_{gs2}$, at the one or more gate terminals 130, 132. The gate impedance, Z, is indirectly correlated to the rate at which the voltages, $V_{gs1}$ and $V_{gs2}$, transition from the on position, $V_{on}$, to the off position, $V_{off}$, at the gate terminals 130, 132. The rate at which the transition occurs at the gate terminals 130, 132 directly correlates to the likelihood and/or amount of gate voltage oscillation that may occur. As the impedance increases, the gate voltage oscillation is further attenuated and may be entirely eliminated.

For example, as gate impedance increases, the rate at which the voltages transition at the gate terminals 130, 132 from the $V_{on}$ to the $V_{off}$ position decreases. The increased gate impedance results in a slow turn-off transition that eliminates or minimizes gate voltage oscillation but increases switching loss. As gate impedance decreases, the rate at which the voltage transitions at the gate terminals 130, 132 from the $V_{on}$ to the $V_{off}$ position increases which results in a smaller switching loss but may cause gate voltage oscillation.

The two or more gate terminal switches 109, 110 and the gate terminal resistors 112, 114 are connected in parallel to the power semiconductor switches 106, 108 via the gate terminals 130, 132 and form a second gate loop 904, as shown in FIG. 9, with the two or more power semiconductor switches 106, 108. The two or more gate terminal switches 109, 110 allow for a moderate-fast turn-off transition. The transition speed of the second gate loop 904 is lower than the transition speed generated by the first gate loop 904 to eliminate gate voltage oscillation. The two or more gate terminal switches 109, 110 may be two MOSFETs, as shown in FIG. 1, two IGBTs as shown in FIG. 2, an IGBT and a BJT, as shown in FIG. 3, a MOSFET and a GaN FET, as shown in FIG. 4, or any other combination of MOSFET, IGBT, BJT or GaN FET.

The gate terminal switches 109, 110 and the gate terminal resistors 112, 114 damp or eliminate the gate voltage oscillation when an overcurrent is detected. The one or more inductors 116, 118 and the one or more resistors 120, 122 may provide a low impedance which causes a fast turn-off transition of the voltages, $V_{gs1}$ and $V_{gs2}$. A fast turn-off transition results in a smaller switching loss than when there is a slow turn-off transition which results from a high impedance. The two or more gate terminal switches 109, 110 and the two or more gate terminal resistors 112, 114 damp or eliminate the subsequent gate voltage oscillation due to the low impedance when an overcurrent occurs without increasing the switching loss.

An overcurrent occurs when the drain current, $i_d$, is greater than or equal to a threshold value. The gate terminal switches 109, 110 do not operate during normal operation when no overcurrent is detected. No overcurrent is detected when the drain current, $i_d$, is less than a threshold value. The two or more gate terminal resistors 112, 114 and the two or more gate terminal switches 109, 110 are in parallel with the two or more power semiconductor switches 106, 108 to form a second gate loop 904, as shown in FIG. 9, with the two or more power semiconductor switches 106, 108.

Figure 6:
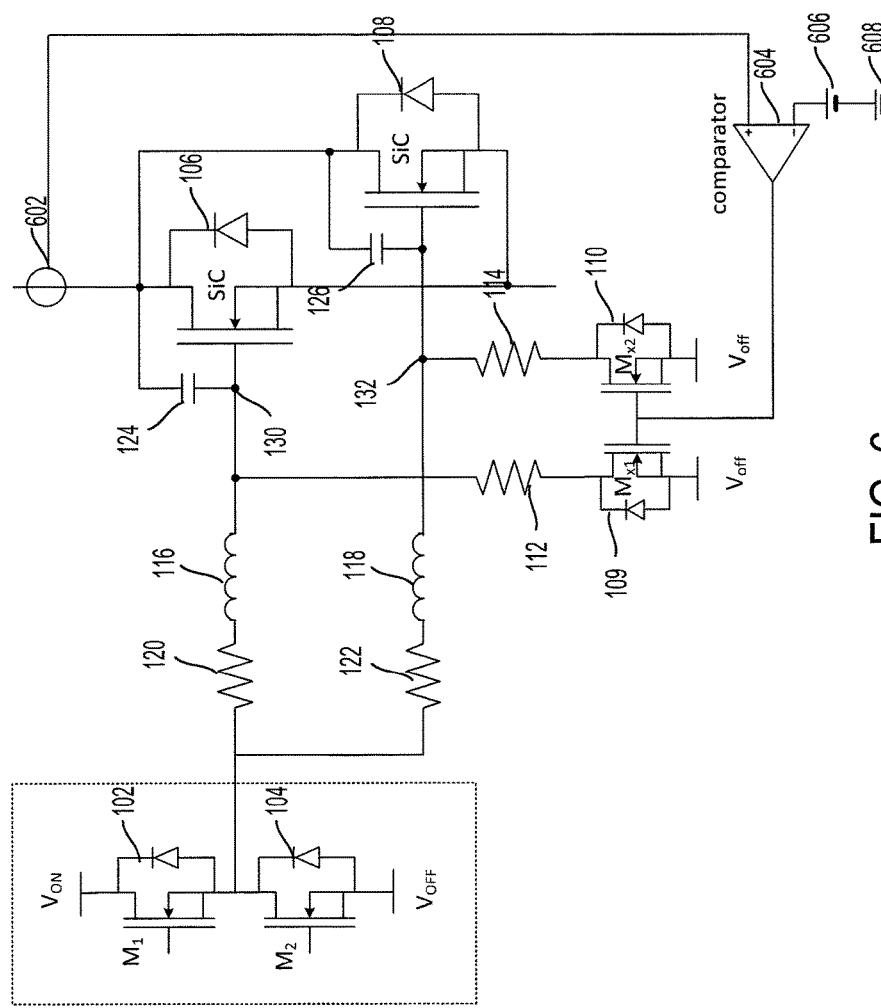
FIG. 6 is a schematic diagram of a gate voltage oscillation damping circuit with a Hall Effect sensor as an overcurrent sensor according to an aspect of the invention.
Figure 7:
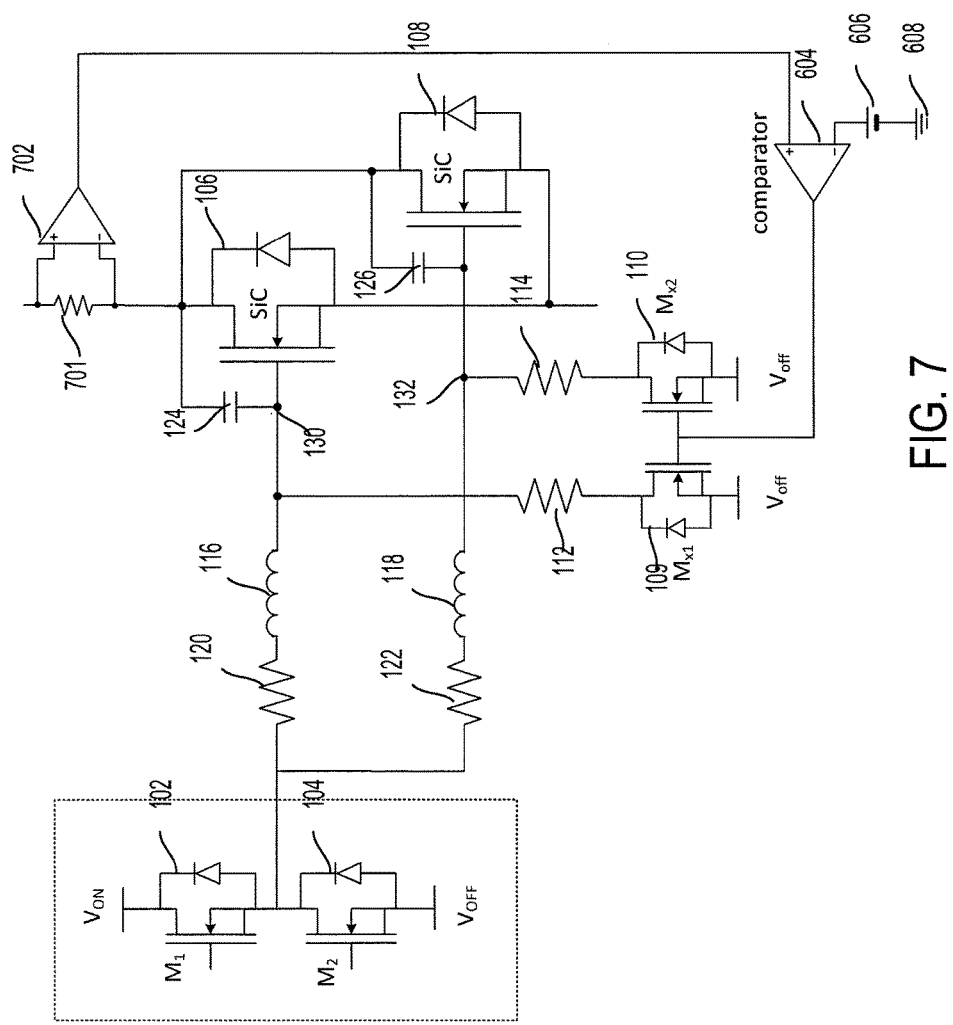
FIG. 7 is a schematic diagram of a gate voltage oscillation damping circuit with a differential amplifier as an overcurrent sensor according to an aspect of the invention.

One or more sensors, e.g., a Hall Effect sensor 602, as shown in FIG. 6, or a differential amplifier 702 with a series-connected resistor 701, as shown in FIG. 7, may detect the overcurrent. The Hall Effect sensor 602 and the differential amplifier 702 are further described in reference to FIGS. 6 and 7, respectively.

Figure 5:
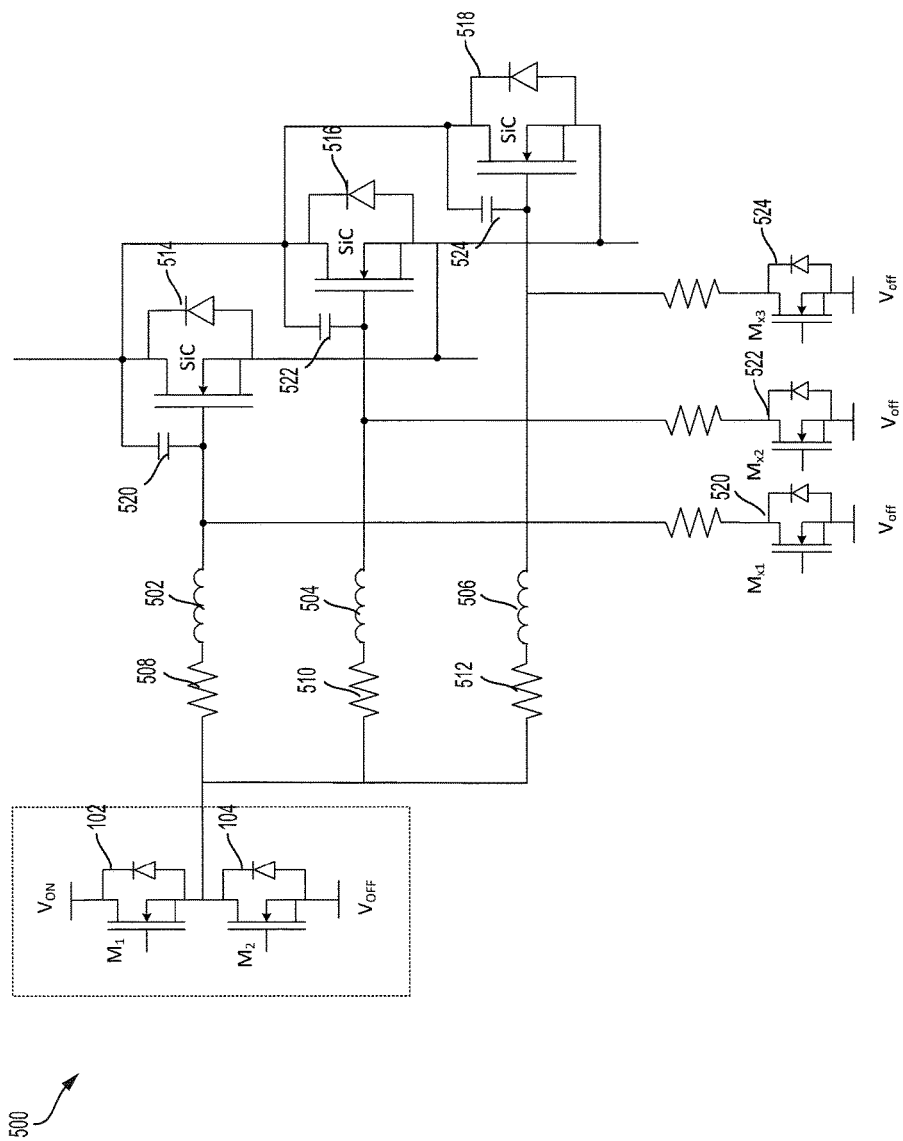
FIG. 5 is a schematic diagram of a gate voltage oscillation damping circuit for three power semiconductor switches in parallel according to an aspect of the invention.

FIG. 5 is a circuit diagram of a gate voltage oscillation damping circuit 500 that powers three paralleled power semiconductor switches. The gate voltage oscillation damping circuit 500 that powers the three paralleled power devices, such as the power semiconductor switches 514, 516 and 518, has similar gate voltage oscillation damping or elimination characteristics as the gate voltage oscillation damping circuit 100 and operates in a similar manner. The gate driver switches 102, 104 drive voltage through the output voltage port to the three power semiconductor switches 514, 516 and 518.

The gate driver switches 102, 104 connect to the three power semiconductor switches 514, 516 and 518 and/or the three gate terminal switches 520, 522 and 524 through the three inductors 502, 504 and 506 and the three resistors 508, 510 and 512.

The one or more inductors 502, 504, and 506 have similar characteristics as the one or more inductors 116, 118, and the one or more resistors 508, 510 and 512 have similar characteristics as the one or more resistors 120, 122. That is, the one or more inductors 502, 504 and 506 and the one or more resistors 508, 510 and 512 provide a gate impedance and connect the gate driver switches 102, 104 to the power semiconductor switches 514, 516 and 518 in a similar manner as the resistors 120, 122 and the inductors 116, 118.

FIG. 6 is a circuit diagram of a gate voltage oscillation damping circuit 100 with a Hall Effect sensor 602 in combination with a comparator 604. The Hall Effect sensor 602 detects overcurrent within the gate voltage oscillation damping circuit 100. The Hall Effect sensor 602 connects to the output terminals of the power semiconductor switches 106, 108. The output terminal of the Hall Effect sensor 602 connects and drives an output voltage to a first input terminal, $V_+$, of the comparator 604. A cell 606 that is connected to a ground 608 may push voltage to a second input terminal, $V_-$, of the comparator 604. The comparator may compare the voltage received at the first and second input terminals and drive a signal to the input of the two or more gate terminal switches 109, 110 to turn on the gate terminal switches 109, 110 when there is an overcurrent.

In some implementations, a differential amplifier 702 may be used to detect an overcurrent. The differential amplifier 702 has two input terminals and an output terminal. Each of the input terminals has a voltage. A resistor 704 is connected in between the two input terminals and causes a voltage drop between the two input terminals. The output terminal is connected to the first input terminal, $V_+$, of the comparator and the cell 606 is connected to the second input terminal, $V_-$, of the comparator 604.

Figure 8:
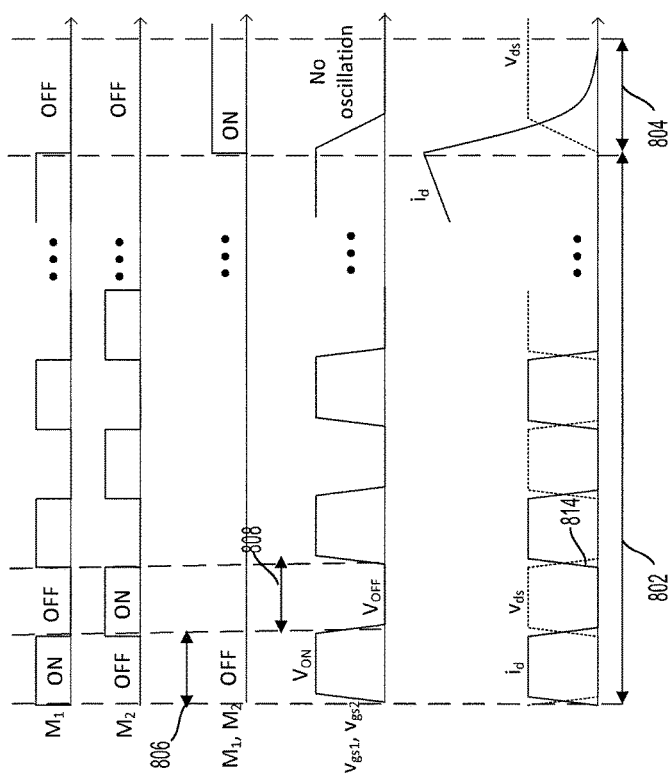
FIG. 8 is a timing diagram of an operation of a gate voltage oscillation damping circuit according to an aspect of the invention.

FIG. 8 is a timing diagram of the gate voltage oscillation damping circuit 100. The timing diagram shows the damping circuit 100 during a time period 802 when the damping circuit 100 is operating normally and during a time period 804 when the damping circuit 100 is operating in a fault condition after an overcurrent is detected. The two gate driver switches 102, 104 alternate asynchronously between the on and off position during the time period 802 when the damping circuit 100 is operating normally. That is, when the gate driver switch 102 is in the on position, the gate driver switch 104 is in the off position, and when the gate driver switch 102 is in the off position, the gate driver switch 104 is in the on position. The switching between the on and off positions of the gate driver switches 102, 104 may be periodic.

During the time period 806, the damping circuit 100 is operating normally and the gate driver switch 102 is in the on position and the gate driver switch 104 is in the off position. The gate driver switches 102, 104 drive a voltage out through the voltage output port. When the gate driver switch 102 is on, and the gate driver switch 104 is off, the voltage out of the voltage output port drives output voltages $V_{gs1}$ and $V_{gs2}$ at the gate terminals 130, 132, respectively, high and the current, $i_d$, into an on position. The two or more gate terminal switches 109, 110 remain in the off position during the time period 802 when the damping circuit 100 is operating normally.

When the gate driver switch 102 transitions into the off position and the gate driver switch 104 transitions into the on position, e.g., during the time period 808, no voltage is driven through the voltage output port. Moreover, the voltages $V_{gs1}$ and $V_{gs2}$ and the drain current, $i_d$, transition into the off position while the drain to source voltage, $V_{DS}$, transitions high. The transition results in a small switching loss 814 due to the low impedance in the damping circuit 100. When the gate driver switch 102 transitions into the on position and the gate driver switch 104 transitions into the off position, e.g., during the time period 810, voltage is driven through the voltage output port and the drain current, $i_d$, transitions into the on position while the drain to source voltage, $V_{DS}$, transitions into the off position which results in a small switching loss 814. If both gate driver switches 102, 104 are in the off position, no voltage is driven through the voltage output port.

At time period 804, a sensor of the damping circuit 100 detects an overcurrent which causes a fault. That is, the sensor has detected a drain current, $i_d$, that is greater than or equal to a threshold current value. For example, magnetic devices, such as inductors and/or transformers, may become saturated causing an unexpected current through the power semiconductor switches 106, 108 which causes an overcurrent. In another example, the power semiconductor switches 106, 108 may short which causes an overcurrent.

In response to detecting the overcurrent, the damping circuit 100 operates under a fault operation during the time period 804. The two or more gate terminal switches 109, 110 are turned on and along with the two or more gate terminal resistors 112, 114 damp or eliminate the gate voltage oscillation without an increase in switching loss. The gate driver switches 102, 104 can be in the off position while the two or more gate terminal switches 109, 110 are on during fault operation. The gate driver switch 102 may alternate between the on and off positions while the two or more gate terminal switches 109, 110 are on during the fault operation. The gate driver switch 104 is in the off position during the fault operation. When the sensor senses the overcurrent, a second gate loop 904 is created. The two or more power semiconductor switches 106, 108 are turned off to protect the power semiconductor switches from damage.

FIG. 9 is a schematic diagram of gate loops for the gate voltage oscillation damping circuit 100. During normal operation a voltage is driven through the first gate loop 902. The first gate loop 902 includes the one or more resistors 120, 122, the one or more inductors 116, 118, and the one or more capacitors 124, 126. The one or more resistors 120, 122 and the one or more inductors 116, 118 provide a small impedance which results in a smaller switching loss when the voltages, $V_{gs1}$ and $V_{gs2}$, transition on and off. However, the small impedance may not eliminate or damp the resulting gate voltage oscillation from resonance generated within the first gate loop 902 when an overcurrent is detected and the voltages, $V_{gs1}$ and $V_{gs2}$, are turned off.

When an overcurrent is detected, a second gate loop 904 is created. The second gate loop 904 includes the two or more gate terminal resistors 112, 114 and the two or more gate terminal switches 109, 110. The two or more gate terminal resistors 112, 114 and the two or more gate terminal switches 109, 110 are in parallel with the two or more power semiconductor switches 106, 108 to form the second gate loop 904. The impedance of the two or more gate terminal resistors 112, 114 and the two or more gate terminal switches 109, 110 of the second gate loop 904 is larger than the impedance of the first gate loop 902 which effectively damps or eliminates the gate voltage oscillation without an increase in switching loss when an overcurrent is sensed and the gate terminal switches 109, 110 are turned on.

Figure 10:
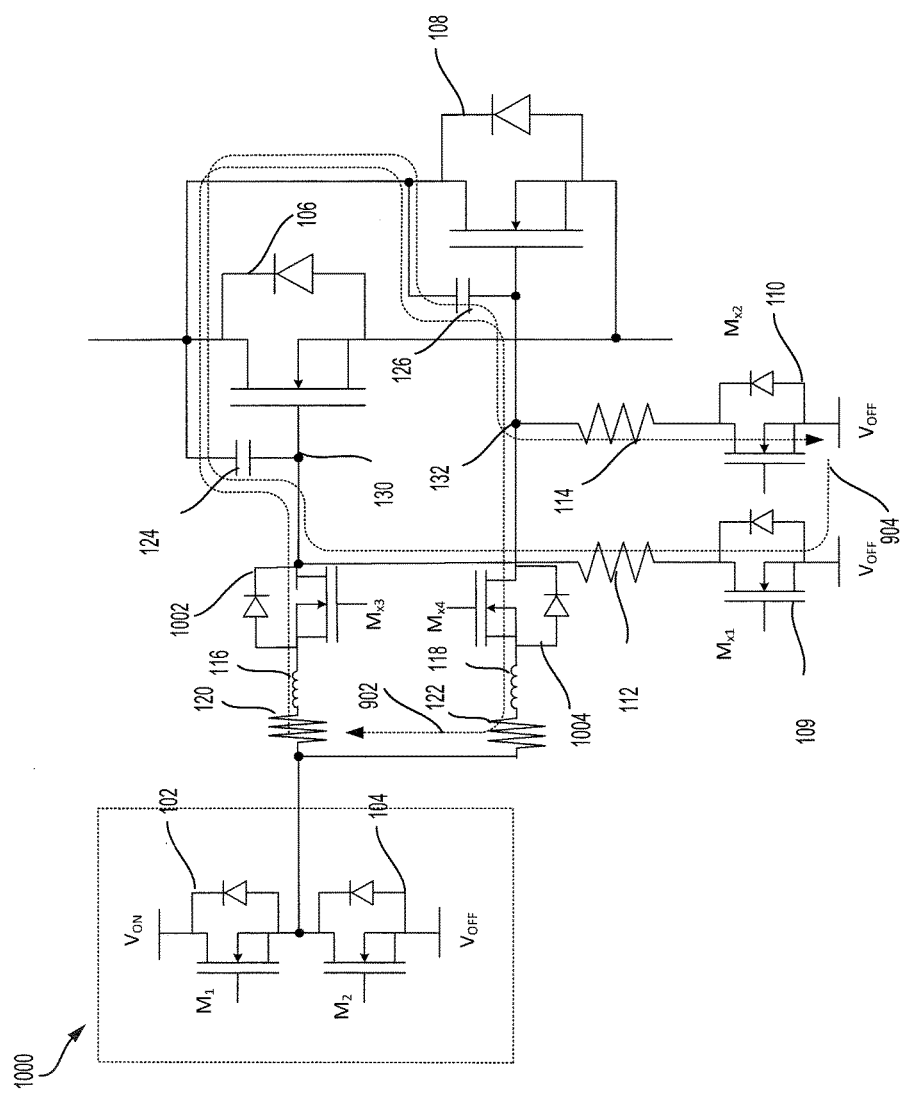
FIG. 10 is a schematic diagram of a gate voltage oscillation damping circuit when the inductance is small according to an aspect of the invention.
Figure 11:
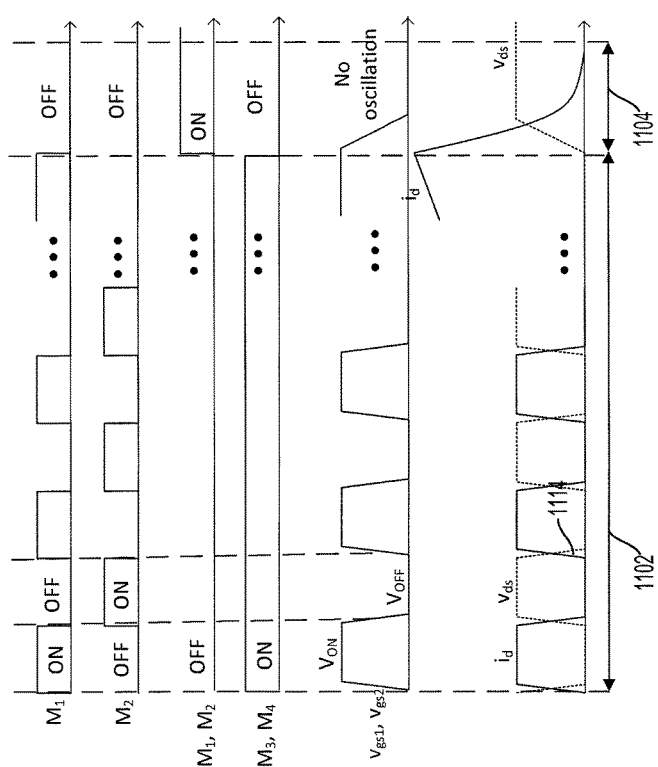
FIG. 11 is a timing diagram of an operation of a gate voltage oscillation damping circuit when the inductance is small according to an aspect of the invention.

FIG. 11 is a timing diagram of the operation of the gate voltage oscillation damping circuit 1000 of FIG. 10. The timing diagram shows the damping circuit 1000 during a time period 1102 when the damping circuit 1000 is operating normally and during a time period 1104 when the damping circuit 1000 is operating in a fault condition after an overcurrent is detected. During normal operation and when the one or more gate driver switches 102, 104 are alternating between the on and off positions, the one or more switches 1002, 1004 are in the on position. A small switching loss 1114 occurs during normal operation. The one or more switches 1002, 1004 switch off when the gate driver switches 109, 110 turn on, as a result of the one or more sensors detecting an overcurrent at the start of time period 1104.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A damping circuit for a semiconductor device, comprising:
    a switch having an input terminal and an output terminal for driving voltage;
    a plurality of resistors connected to the output terminal of the switch including a first resistor and a second resistor;
    a plurality of inductors that include a first inductor and a second inductor, an input of the first inductor connected to the first resistor and an input of the second inductor connected to the second resistor;
    a plurality of capacitors that include a first capacitor and a second capacitor and configured to provide a capacitance for electrical storage, an input of the first capacitor connected to an output of the first inductor at a first gate terminal and an input of the second capacitor connected to an output of the second inductor at a second gate terminal;
    a plurality of power semiconductor switches including a first power semiconductor switch and a second power semiconductor switch, the first power semiconductor switch being connected to the output of the first inductor at the first gate terminal and the second semiconductor switch being connected to the output of the second inductor at the second gate terminal;
    a plurality of gate terminal switches including a first gate terminal switch and a second gate terminal switch; and
    a plurality of gate terminal resistors including a first gate terminal resistor connected in series with the first gate terminal switch and a second gate terminal resistor connected in series with the second gate terminal switch, the first gate teiininal resistor and the first gate terminal switch being connected in between the first power semiconductor switch at the first gate terminal and a ground, the second gate terminal resistor and the second gate terminal switch being connected in between the second power semiconductor switch at the second gate terminal and the ground.

2. The damping circuit of claim 1, wherein the switch includes at least one or more metal oxide silicon field effect transistors (MOSFET), one or more insulated gate bipolar transistors (IGBT), one or more bipolar junction transistors (BJT), or one or more gallium nitride field effect transistors (GaN FET).

3. The damping circuit of claim 1, wherein the plurality of gate terminal resistors and the plurality of gate terminal switches form a gate loop that eliminates gate voltage oscillation without increasing switching loss when an overcurrent is detected.

4. The damping circuit of claim 1, wherein the first gate terminal switch is a MOSFET, IGBT, BJT or GaN FET and the second gate terminal switch is a MOSFET, IGBT, BJT, or GaN FET.

5. The damping circuit of claim 1, wherein the first power semiconductor switch is a MOSFET, IGBT, BJT or GaN FET and the second power semiconductor switch is a MOSFET, IGBT, BJT, or GaN FET.

6. The damping circuit of claim 1, wherein the plurality of power semiconductor switches includes a third power semiconductor switch, wherein the third power semiconductor switch is connected in parallel with the first power semiconductor switch and the second power semiconductor switch, wherein the plurality of gate terminal resistors includes a third gate terminal resistor, wherein the plurality of gate terminal switches includes a third gate terminal switch connected in series with the third gate terminal resistor, wherein the third gate terminal resistor and the third gate terminal switch is connected in between the third power semiconductor switch at a third gate terminal and the ground.

7. The damping circuit of claim 1, further comprising a sensor connected to the plurality of gate terminal switches and configured to detect a fault condition including a current load greater than or equal to a threshold value, wherein the sensor includes a comparator that compares the current load with the threshold value.

8. The damping circuit of claim 7, wherein the sensor is a Hall Effect sensor.

9. The damping circuit of claim 7, wherein the sensor includes a differential amplifier with a series-connected resistor.

10. The damping circuit of claim 1, wherein the switch drives the voltage to the first power semiconductor switch through the first gate terminal and to the second power semiconductor switch through the second gate terminal, wherein the voltage alternates between on and off.

11. The damping circuit of claim 10, wherein the first gate terminal switch and the second gate terminal switch turn on when a sensor detects that a current is greater than or equal to a threshold value.

12. The damping circuit of claim 1, wherein the plurality of resistors and the plurality of inductors are configured to provide impedance that is directly correlated with an amount of switching loss that results from the voltage transitioning off.

13. A damping circuit for a semiconductor device, comprising:
    a plurality of power semiconductor switches;
    a sensor connected to the plurality of power semiconductor switches and configured to detect an overcurrent fault;

a plurality of gate terminal resistors connected in parallel to the plurality of power semiconductor switches; and
a plurality of gate terminal switches connected in series to the plurality of gate terminal resistors, the plurality of gate terminal resistors and the plurality of gate terminal switches being connected in between the plurality of power semiconductor switches and a ground and being configured to eliminate gate voltage oscillation.

14. The damping circuit of claim 13, wherein the plurality of gate terminal switches turn on when the overcurrent fault is detected by the sensor to eliminate gate voltage oscillation without an increase in switching loss.

15. The damping circuit of claim 13, further comprising:
a plurality of gate driver switches including a first gate driver switch and a second gate driver switch that asynchronously switch between an on position and an off position, wherein a voltage from an output voltage port of the plurality of gate driver switches is driven into a plurality of gate terminals of the plurality power semiconductor switches when the first gate driver switch is on and the second gate driver switch is off.

16. The damping circuit of claim 15, wherein no voltage is driven through the plurality of gate terminal switches until the overcurrent fault is detected by the sensor.

17. The damping circuit of claim 13, wherein the sensor detects the overcurrent fault that triggers the plurality of gate terminal switches to turn on.

18. A damping circuit for a semiconductor device, comprising:
one or more gate driver switches having an output voltage port for driving voltage;
a first gate loop for normal operation, the first gate loop having:
 a plurality of power semiconductor switches having a plurality of gate terminals,
 a plurality of resistors connected to the one or more gate driver switches,
 a plurality of inductors connected to the plurality of resistors, the plurality of resistors and the plurality of inductors providing an impedance, and
 a plurality of capacitors connected to the plurality of inductors and the plurality of power semiconductor switches; and
a second gate loop for eliminating gate voltage oscillation when a fault condition is detected and having a plurality of gate terminal resistors connected to the plurality of gate terminals, and a plurality of gate terminal switches, the plurality of gate terminal resistors and the plurality of gate terminal switches configured to eliminate the gate voltage oscillation.

19. The damping circuit of claim 18, wherein the plurality of resistors and the plurality of inductors provide impedance for a fast turn-off transition of a current.

20. The damping circuit of claim 18, wherein the fault condition is detected when a current is greater than or equal to a threshold value.

* * * * *